United States Patent
Odagaki et al.

(10) Patent No.: US 7,082,261 B2
(45) Date of Patent: Jul. 25, 2006

(54) HEATING STAGE

(75) Inventors: Toru Odagaki, Hyogo (JP); Yoichi Mizukawa, Hyogo (JP)

(73) Assignee: Ushio Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/090,031

(22) Filed: Mar. 28, 2005

(65) Prior Publication Data

US 2005/0213951 A1   Sep. 29, 2005

(30) Foreign Application Priority Data

Mar. 26, 2004   (JP)   ............... 2004-092303
Jun. 7, 2004    (JP)   ............... 2004-168681

(51) Int. Cl.
*F26B 3/30*   (2006.01)
(52) U.S. Cl. ............ 392/418; 392/416; 219/390; 219/405; 219/411; 118/724; 118/50.1
(58) Field of Classification Search ............... 219/390, 219/405, 411; 392/416, 418; 118/724, 725, 118/50.1

See application file for complete search history.

(56) References Cited

U.S. PATENT DOCUMENTS

| 4,694,143 A * | 9/1987 | Nishimura et al. ......... 219/388 |
| 6,753,507 B1 | 6/2004 | Fure et al. |
| 2003/0183616 A1 | 10/2003 | Goto |

FOREIGN PATENT DOCUMENTS

JP   P2002-329566 A   11/2002
JP   P2004-6242 A     1/2004

* cited by examiner

*Primary Examiner*—Shawntina Fuqua
(74) *Attorney, Agent, or Firm*—Rader, Fishman & Grauer PLLC

(57) ABSTRACT

A heating stage according to the present invention comprises a flat stage portion on which a work piece is placed, a glass section having cylindrical portion in which two or more lamps are disposed as a heating unit, and a metal section having a cylindrical portion and a bottom portion forming an inner space by fixing the metal section and the glass section integrally wherein the inner space is under reduced pressure, and inert gas is filled.

6 Claims, 7 Drawing Sheets

ø200 Wafer

Preset Temperature  750°C

① 0 (Center) 746.0°C     ⑥ 190mm 751.5°C
② 100mm 759.9°C          ⑦ 125mm 766.1°C
③ 100mm 758.7°C          ⑧ 150mm 770.5°C
④ 150mm 763.0°C          ⑨ 190mm 760.6°C
⑤ 150mm 736.6°C Average 757.0°C  +13.5°C / −20.4°C

HEATING STAGE

FIELD OF THE INVENTION

The present invention relates to a heating stage, and more specifically to a heating stage which constitutes a heating unit or section in a chamber of a heating device for heating a semiconductor wafer, a glass substrate, and the like.

DESCRIPTION OF THE RELATED ART

A heating stage is used to form a semiconductor thin film on a wafer such as a semiconductor wafer, liquid crystal substrate or circuit board wafer etc., or to form a resist film by drying and burning resist liquid applied on the wafer. In general, as for the heating unit disposed in the heating stage, in many case, resistance heating is used, and for example, a ceramic heater like a silicon-carbide (SiC) heater has been used.

A wafer heating apparatus which uses such a silicon-carbide heater is disclosed in Japanese Laid Open Patent No. 2002-329566.

Moreover, Japanese Laid Open Patent No. 2004-6242 discloses that a ceramic heater that uses high melting point metals, such as a tantalum, and a tungsten, a molybdenum as a resistance heating element, and that uses aluminum nitride, silicon nitride, boron nitride, sialon, etc. as substrate ceramics.

FIG. 6 shows a schematic view of a heating stage comprising a ceramic heater.

A resistance heating element 42 in a ceramic substrate 43 of the heating stage 200 is, for example, integrally sintered, and the resistance heating element 42 generates heat by electric supply from a power feeder 41, thereby heating a work piece $W_F$ to be heated.

SUMMARY OF THE INVENTION

However, as set forth below, such a ceramic heater has problems in a process in which a high degree of cleanness is required as in a semiconductor process. That is, if a ceramic heater is in a state where it is heated to high temperature such as 700 to 800 degrees Celsius, impurities adsorbed in minute unevenness or gaps of ceramic are discharged, and are adsorbed on a wafer thereby causing contamination or defective piece. Contamination of such a wafer is called "Contamination."

Moreover, a conventional heating stage has a problem that "takt" time for exchanging the work piece to be heated in a heating process will become long, since it takes time for the temperature of the heating stage to drop, after heating.

An object of the present invention is to provide a heating stage in which a work piece to be heated, such as a wafer etc. can be heated to high temperature, in place of the conventional ceramic heater.

It is another object of the present invention to provide a heating state in which contamination of such a work piece, which is caused due to generation of impurities during heating, can be prevented.

It is further object of the present invention to provide a heating stage, in which the temperature dropping property is improved.

In view of the above problems, the objects of invention will be accomplished by a heating stage comprising a flat stage portion on which a work piece is placed, a glass section having cylindrical portion in which two or more lamps are disposed as a heating unit, and a metal section having a cylindrical portion and a bottom portion forming an inner space by fixing the metal section and the glass section integrally wherein the inner space is under reduced pressure, and inert gas is filled.

Since the stage section on which a work piece to be heated is placed is made of glass, impurities are not adsorbed thereon, and even where it is heated to high temperature, there is no generation of impurities, so that the problem of the contamination to the work piece such as a wafer is eliminated. Moreover, since the interior space of the stage section where the lamp is disposed, is insulated from the outside, contamination from a lamp or wiring of the lamp is eliminated.

In the heating stage, the lamps may have sealing portions at both end and a sealing body having a filament therein, and the sealing portion is bent in an opposite direction to a surface of the flat stage portion. Accordingly, it is possible to heat a work piece uniformly since the rate at which a non-light emitting portion of a lamp faces an upper surface of the stage section decreases. Moreover, it is possible to closely arrange light emitting portions of the lamps which are adjacent to each other so that the rate at which non-light emitting portion of the lamps face a surface of the stage section is reduced thereby heating the work piece uniformly. Furthermore, it is possible to easily arrange the wiring from a lamp in a direction of a connector section disposed in the opposite side to an upper face of the stage section and further an operation of connecting or rolling up wire becomes easy.

The heating stage may further include a light reflecting plate made of ceramic fiber on a backside of the lamp. Accordingly, since a sheet made of ceramic fiber is placed as a reflecting member the back of the lamp, it is possible to provide such a reflecting member which is strongly excellent in insulation properties and can withstand a thermal shock.

The heating stage may further include a cooling unit in the stage portion. Accordingly, it is possible to rapidly drop the temperature of the stage section and shorten the "takt" time of a heating process by providing a cooling unit in the stage section.

In the heating stage, the cooling unit may be a coolant blow-off pipe disposed under the stage portion. Accordingly, arrangement of the cooling unit is easy and the stage is effectively cooled down because the cooling unit comprises a coolant gas blow-off pipe disposed in a lower portion of the stage.

In the heating stage, the stage portion may have a hollow structure, and further including a coolant gas introducing unit wherein the coolant gas pass through gaps of the hollow structure. Accordingly, the stage is effectively cooled down since the stage section is made into a hollow structure, wherein coolant gas is filled in the hollow of the hollow structure thereby realizing space saving.

DESCRIPTION OF THE PREFERRED EMBODIMENTS

Description of an embodiment according to the present invention will be given below referring to FIGS. 1 to 4.

Figure 1:
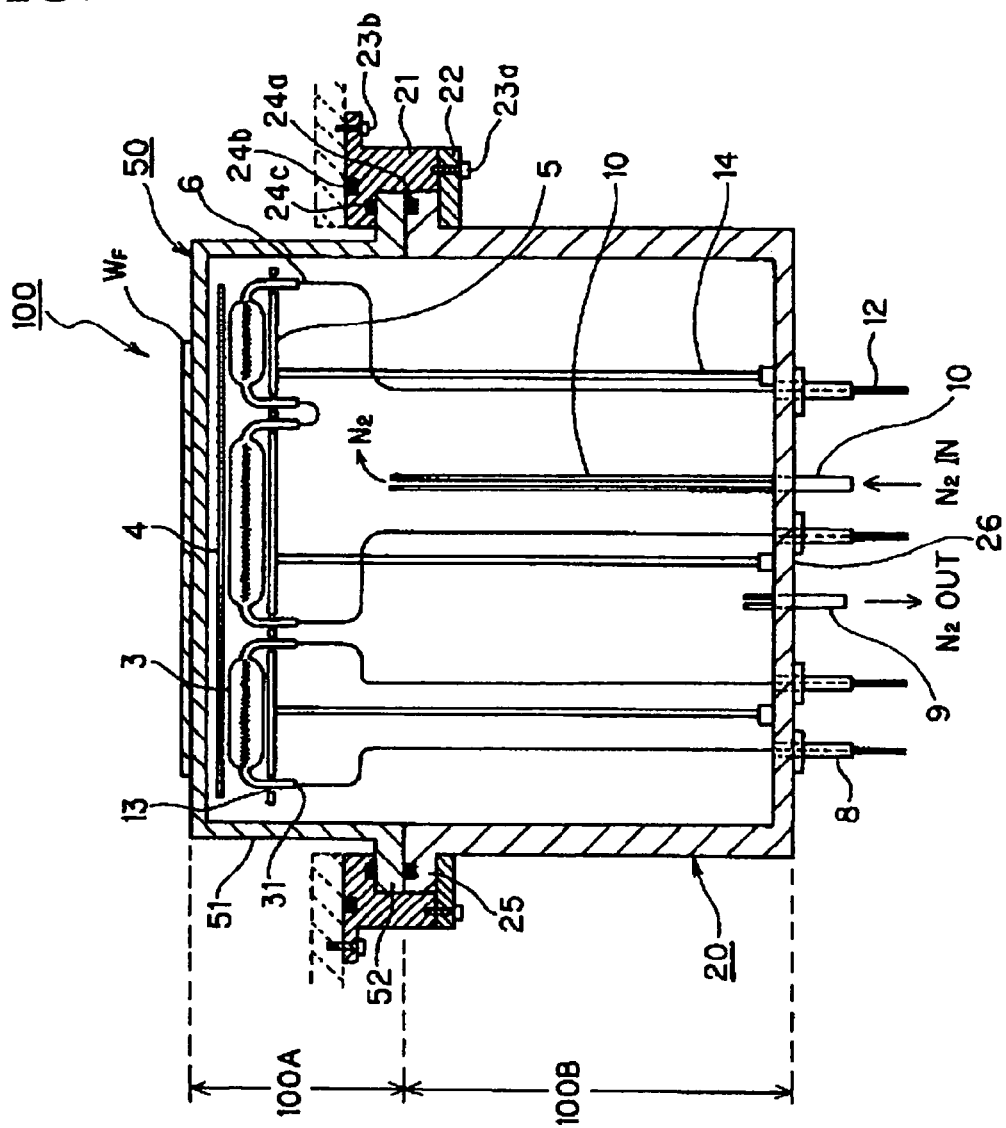
FIG. 1 is a schematic cross sectional view showing a heating stage according to the present invention which is used for wafer heating etc.

FIG. 1 is a schematic cross sectional view showing a heating stage according to the present invention which is used for wafer heating etc.

In the figure, a numeral 100 shows the entire heating stage. A glass stage portion 50 is made of quartz glass etc., and is flat. On an upper portion of the glass stage portion, a work piece(s) such as a wafer is placed.

Below the glass stage portion 50, a cylindrical portion 51 in which two or more lamps 3 for efficiently emitting infrared radiation is accommodated therein as a heater is provided. At an end portion of the cylindrical portion 51, a glass section 100A having a flange portion 52 and a metal flange portion 25 which is air-tightly in face-contact with the flange portion 52. Next to the metal flange portion 25, a cylindrical metal case section 20 and a bottom portion 26 are provided in that order. A metal section 100B and the glass section 100A form an inner space in which the pressure is reduced or inert gas is filled up, by integrating them. The metal section is made of, for example, stainless steel.

The glass flange portion 52 and the metal flange portion are fixed by a holding member 21 and a holding member 22 through an O-ring 24a. The holding member 21 and the holding member 22 are fixed by a screw 23a and further, fixed to a member outside the heating stage by a screw 23b. An O-ring 24c is provided between the holding member 22 and the glass flange portion 52, and an O-ring 24b is provided between the holding member 22 and the member outside the heating stage.

As shown in the figure, the light reflecting plate 5, lamps 3, and a heat spreader 4 are supported by a supporting pole member 14 from the bottom portion 26 of the metal section 100B. Maintenance of the light reflecting plate 5, lamps 3, and the heat spreader 4 can easily be performed by removing the glass section 100A upward. In addition, a method for supporting the light reflecting plate 5, the lamps 3, and the heat spreader 4 is not limited to this example.

Although not illustrated, the circumference of the metal flange portion 25 is cooled down by water for heat-resistant protection of the O-rings 24a, 24b, and 24c.

The heat spreader 4 made of carbon is provided between the upper portion of the glass stage portion 50 and the lamps 3. The light reflecting plate 5 made of ceramic fiber is provided under the lamps 3 and reflects light emitted from the lamps, to the heat spreader side. An end of one of the lamps 3 is connected through a lamp lead wire 6 to an external power supply line 12 for connecting to an external power supply. An end of a (the) lamp 3 is connected to an input terminal 8. A wafer $W_F$ is provided on the glass stage portion 50. Lamp sealing portions 31 pass through respective through holes 13 which are provided in the light reflecting plate 5.

The interior space of the heating stage 100 of the present invention is purged by the pressure of 13.3 kPas with nitrogen in this embodiment. Thus, even if the temperature of the lamps 3 rises during heating, oxidization of seal foil 32 used for the lamp sealing portions 31 of the lamps 3 is prevented. Nitrogen is introduced in the interior space near the sealing portion 31 of the lamps from a gas introducing inlet 10 as shown in FIG. 1. Further, the gas is discharged from a gas discharging outlet 9 provided near the bottom portion 26 of the metal section 100B in the interior space of the heating stage 100. Atmosphere of sufficient nitrogen is maintained near the sealing portions of the lamps 3 so that metallic foil oxidization of the sealing portions 31 are prevented.

Moreover, since the stage section 50 is made of glass, impurities are not adsorbed, and even thought the stage section 50 is heated at high temperature, impurities is not generated so that the problem of the contamination to a wafer is eliminated. Moreover, since the interior space of the heating stage 100 where lamps 3 are arranged is insulated from the outside, the contamination of the stage from the lamps 3 or wiring of the lamps 3 is also eliminated.

Figure 2:
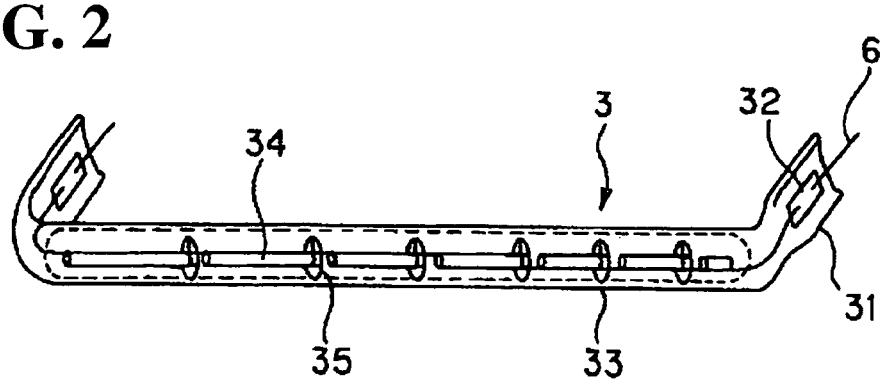
FIG. 2 is a perspective view of the structure of the lamp 3.

FIG. 2 is a perspective view of the structure of the lamp 3.

In this figure, at a lamp sealing portion 31, a filament 34 and the lamp lead wire 6 are connected to each other through the seal foil 32. The lamp sealing portion 31 is bent at, for example, right angle with respect to a direction that the tube shaped sealing body extends. Thus, the lamp sealing portion 31 extends on the opposite side to the upper surface of the glass stage portion 50. The seal foil 32 is made of molybdenum foil etc. The sealing body 33 (or bulb) is a cylinder made of glass. A filament 34 is inserted in the bulb 33 and supported by a supporter 35. In addition, halogen gas is enclosed in the bulb 33. This type of tube shaped sealing body which has sealing portions at both ends is called a double end type lamp.

The filament 34 is red-heated when applying current to the lamp lead wires 6 connected to both ends of the lamp 3, and the filament 34 emits infrared radiation. The infrared radiation emitted from the filament 34 is irradiated onto the heat spreader 4 provided under the glass stage portion 50 and the heat spreader 4 uniformly heats the work piece $W_F$ such as a wafer.

Figure 3A:
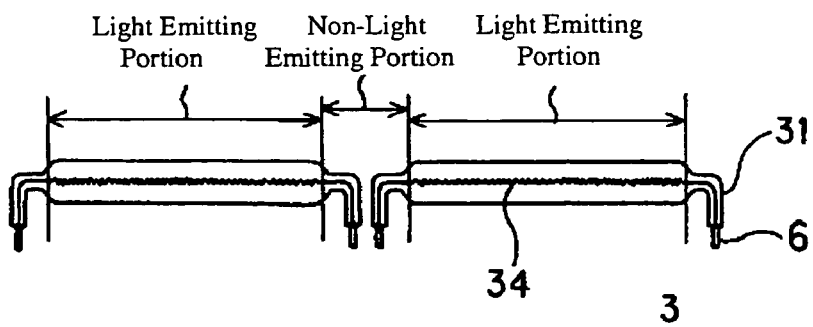
FIG. 3A is a side view of the lamp 3 according to the present invention.
Figure 3B:
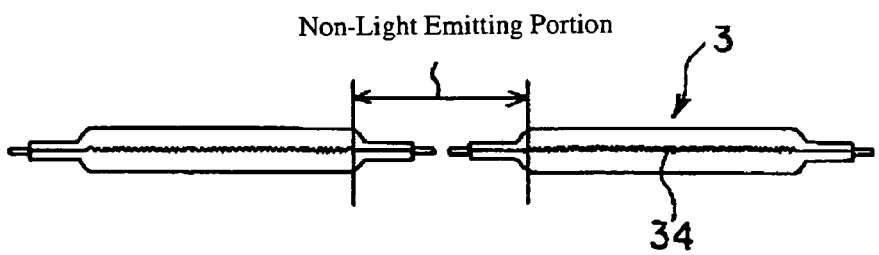
FIG. 3B is a side view of a comparative example of lamps.

FIGS. 3A and 3B are diagrams explaining the advantages in the case that the lamp sealing portions 31 of the lamp 3 are bent.

FIG. 3A is a side view of the lamp 3 according to the present invention, and FIG. 3B is a side view of a comparative example of lamps.

Hereinafter, portions of the lamp 3 from which infrared radiation is emitted is called light emitting portions, and the lamp sealing portions 31 from which light is not substantially emitted is called a non-light emitting portion. Assuming that as shown in FIG. 3B, the non-light emitting portion of the lamp faces the surface of the glass stage portion 50, a portion of the work piece $W_F$ corresponding to the non-light emitting portion is hardly heated.

On the other hand, as shown in FIG. 3A, when the lamp sealing portions 31 are bent in a direction opposite to the upper surface of the glass stage portion 50, proportion (non-light emitting portion to light emitting portion) of the area where the non-light emitting portion faces the upper surface of the glass stage portion 50 decreases so that the work piece $W_F$ is heated uniformly.

Moreover, if the lamp sealing portion 31 is bent, it is possible to arrange the light emitting portions of the adjacent lamps. Similarly to the above, it is possible to uniformly heat the work piece $W_F$ by reducing non-lighting portion to lighting portion ratio or ratio of a surface area of the glass stage portion 50 where the non-lighting portion faces.

Figure 4:
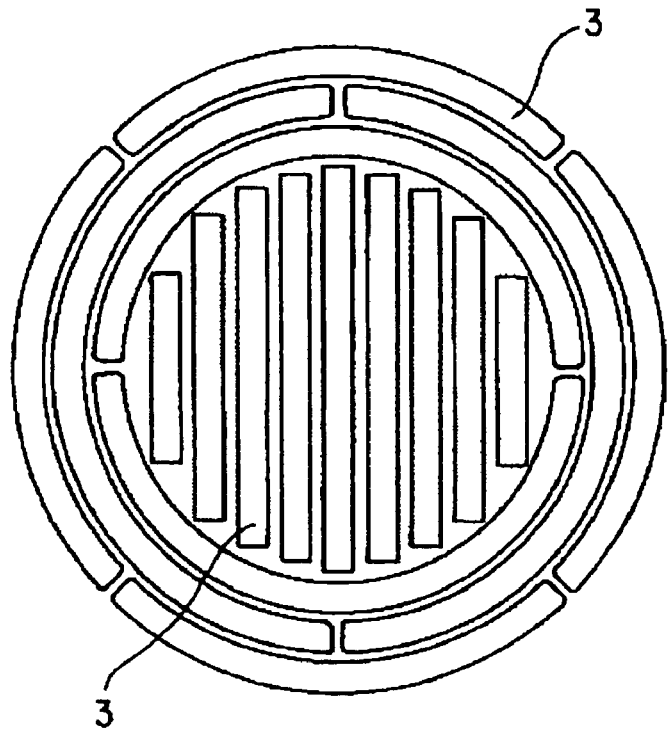
FIG. 4 is a top plan view of the lamp 3 when the heating stage 1 shown in FIG. 1 is viewed from the upper surface side.
Figure 5:
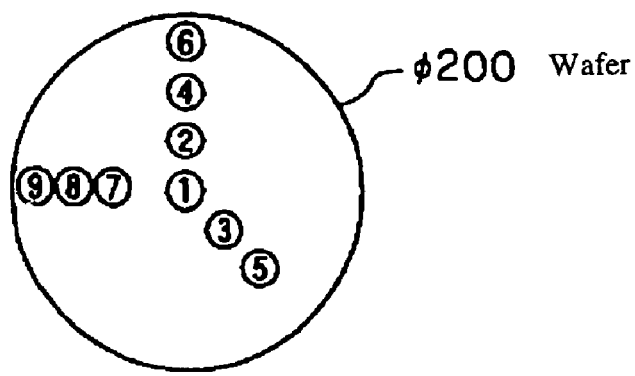
FIG. 5 is a diagram explaining experimental results in case that a wafer is heated by the heating stage according to the present invention.
Figure 6:
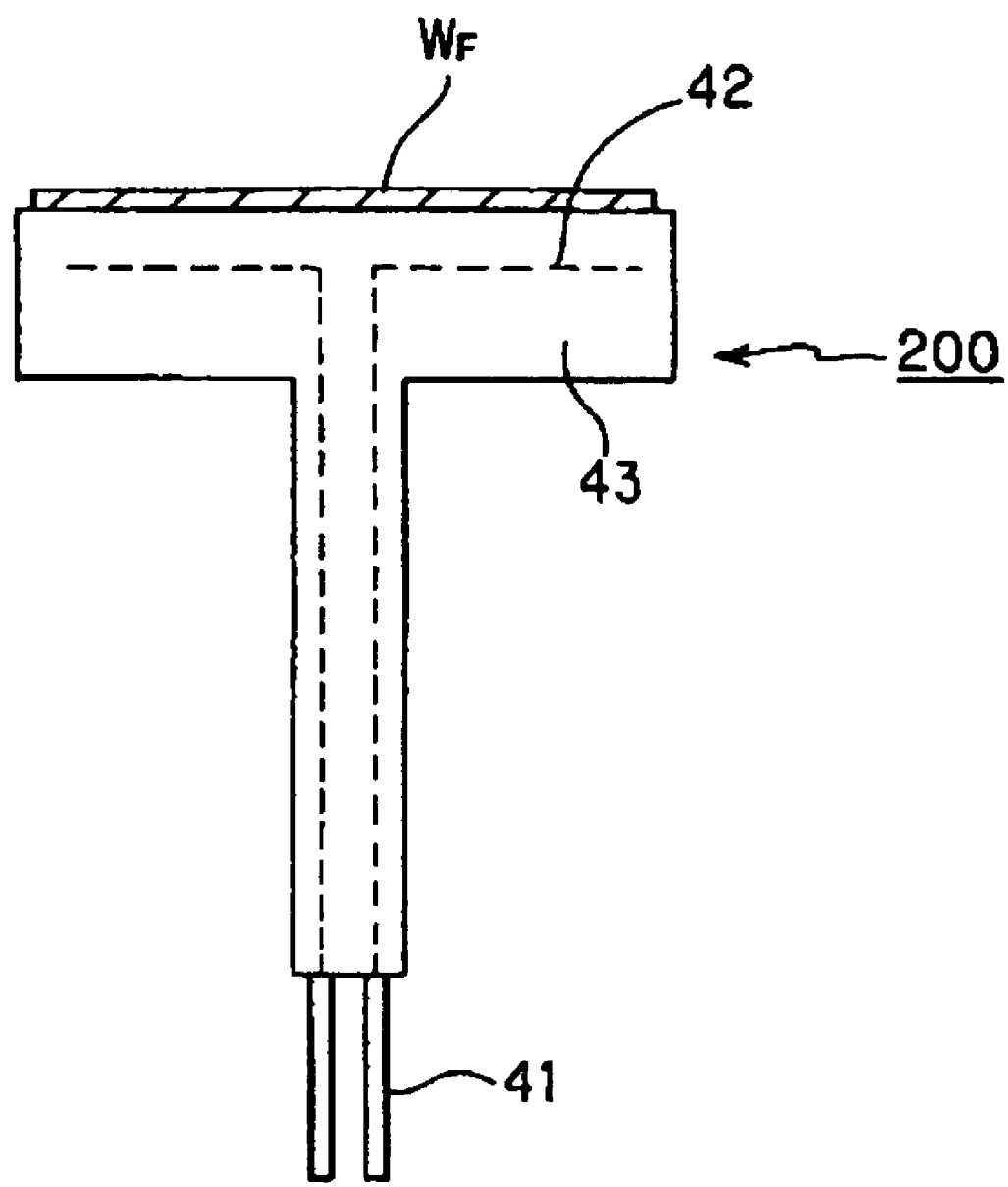
FIG. 6 shows a schematic view of a heating stage comprising a ceramic heater.

FIG. 4 is a top plan view of the lamp 3 in case that the heating stage 1 shown in FIG. 1 is viewed from the upper surface side.

As shown in this figure, two or more straight tube shaped sealing body lamps 3 are arranged therein and two or more circular lamps 3 (partially ring-like or annular lamps 3) are concentrically arranged outside the straight tube shaped sealing body lamps.

As to the ring-like lamps 3, semicircle lamps and quarter circle lamps 3 are combined and arranged in order to form a toric arrangement. (The lamps of semicircle form in which a circle is divided into two parts and of quarter-circle form in which a circle is divided into 4 parts are arranged in circular from.) Although one ring-like lamp may be used in order to form the circle, manufacture will become difficult when the length of the sealing body becomes long, since a diameter thereof becomes large. Accordingly, shorter and divided lamps are used in the present invention. Lamps divided into 4 or more may be used for the present invention.

Furthermore, in this figure, the straight tube shaped lamps 3 may be replaced with a circular or ring-like lamp(s) like the outside ring-like lamps 3 provided outside the straight tube shaped lamps 3.

Moreover, in case of a wafer having a small diameter and small area, a lamp having a whorl shaped (spirally formed) sealing body may be used for the ring-like or circular lamps 3 and straight tube shaped lamps 3.

Moreover, as for a work piece $W_F$ to be heated, heat is released from the side of the work piece during heating, and the temperature of the circumference portion tends to be lower than that of the central portion. Therefore, two or more lamps 3 used for a heating unit are divided into two or more zones and electric power control to each zone may be carried out by an electric power control unit not shown. For example, when the lamp 3 is arranged as shown in FIG. 4, electric power control of a group of the straight tube shaped lamps, and a group of the ring-shaped lamps is separately carried out. The temperature of the circumference portion of the work piece $W_F$ such as a wafer tends to become low. Based on results of experiments for measuring temperature difference between the center portion and the circumference portion, an input electric power to the outside ring-shaped lamps is controlled so that output of the outside ring-shaped lamps becomes larger than that of the inside straight tube shaped lamps. The lamps 3 are connected in series and electric power applied to two or more lamps may be controlled as one zone.

Next, details of the light reflecting plate 5 will be described below referring to FIG. 1.

As shown in this figure, the light reflex board 5 is provided in the opposite side to the upper surface of the glass stage portion 50 of the lamp 3, and is made of ceramic fiber which consists of alumina, or alumina and a silica, since such material has thermal resistance of 700 degrees Celsius or more, and reflects infrared region light effectively, and furthermore, it is necessary for the plate 5 to have no short problem so that the light reflecting plate 5 can be provided near the lamp lead wire 6.

In addition, the light reflecting plate 5 is not limited to the ceramic fiber plate, but as the light reflecting plate 5, glass plate such as quartz, may be used wherein high purity alumina is formed on the quartz.

The through holes 13 are provided on the light reflecting plate 5, in which the bent lamp sealing portions 31 is inserted. The lamp sealing portions 31 are inserted in the respective through holes 13 so that light emitted from the lamps 3 is not emitted to the lamp sealing portions 31 and temperature rise of the lamp sealing portions 31 is prevented. By using a ceramic plate as the light reflecting plate 5, light emitted from the lamps 3 in a direction which is opposite to the upper surface side of the glass stage portion 50 is reflected toward the upper surface of the glass stage portion 50 so that it is possible to increase heat efficiency of the work piece $W_F$.

As shown in the figure, when the work piece $W_F$ should be heated uniformly, the heat spreader 4 is provided between the lamps 3 and the upper surface of the glass stage portion 50. The light from the lamps 3 is irradiated onto the heat spreader 4, and the work piece $W_F$ placed on the upper surface of the glass stage portion 50 is heated by the radiation from the heat spreader 4. The carbon plate used for the heat spreader 4 has high thermal conductivity, and uniformly causes temperature rise as a whole since heat can be conducted to portions where there is no light emitting portion of the lamps 3. Therefore, the work piece $W_F$ can be heated uniformly.

Next, description of the experimental results in case that the heating stage according to the present invention is heated will be given below referring to FIG. 4.

In addition, although the structure of the heating stage 1 is basically the same as that shown in FIG. 1, and the number of the lamps 3 used for the experiments were 33 and the reflecting plate 5 was used but the heat spreader 4 was not used. As a work piece $W_F$ to be heated, a silicon wafer of $\phi$200 mm was used, and the temperature of the nine points on the surface was measured by a thermocouple when heating the surface at the preset temperature of 750 degrees Celsius. The mean temperature of the nine points was 757 degrees Celsius, and the temperature distribution was in the range between +13.5 degrees and −20.4 degrees and the variation within a field distribution was ±2.2%.

Next, the structure and effects of a cooling unit of the heating stage according to the present invention will be described below.

Figure 7A:
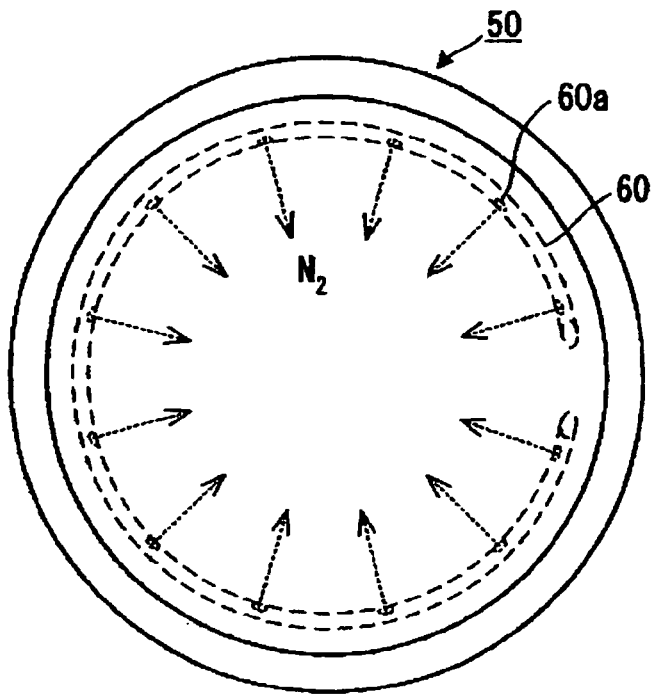
FIG. 7A is a top plan view thereof showing arrangement of the heating stage including the coolant gas blow-off pipe 60 shown in broken lines.
Figure 7B:
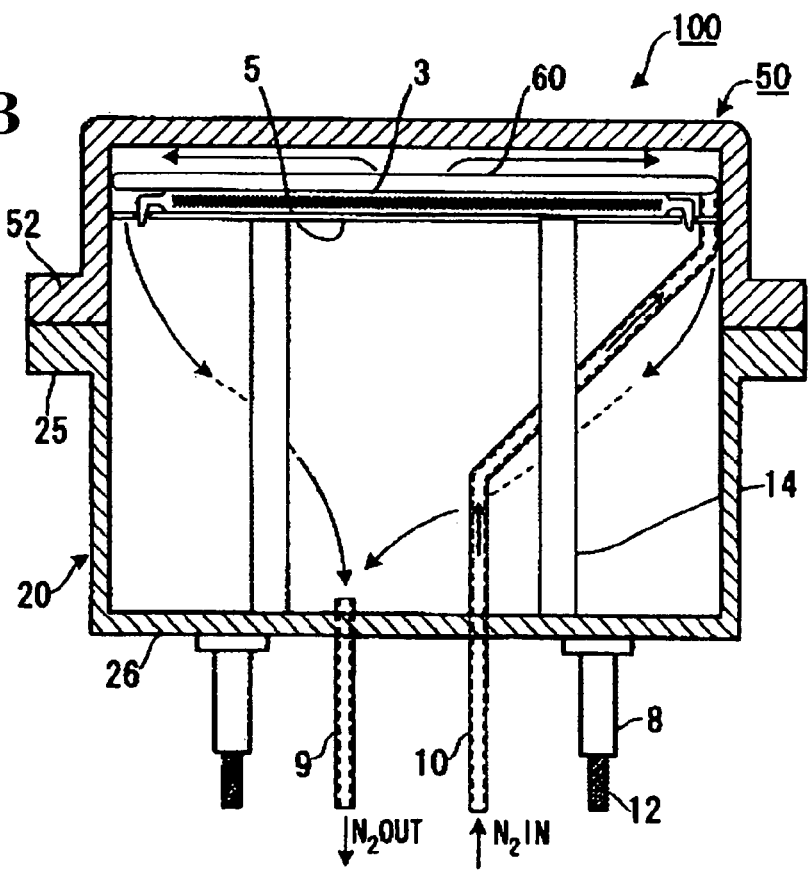
FIG. 7B is a cross-sectional view of a heating stage 100 showing arrangement of the coolant gas blow-off pipe 60.
Figure 9:
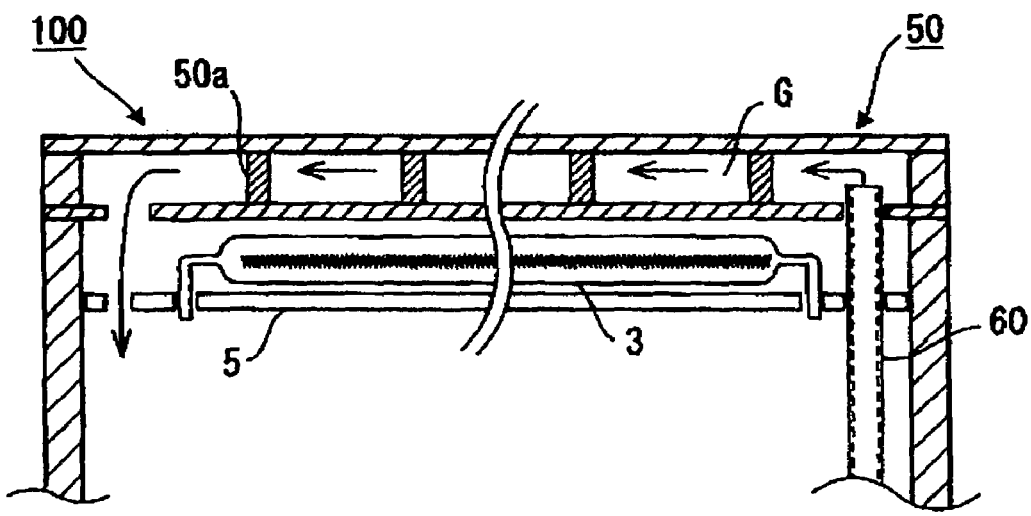
FIG. 9 shows the hollow structure provided in the glass stage portion 50 wherein gaps G are provided by two or more supports.

FIGS. 7A, 7B and 9 show examples of the structure of the cooling unit. FIGS. 7A and 7B show the structure of the cooling unit in which a coolant gas blow-off pipe is provided under the glass stage portion 50.

FIG. 7A is a top plan view thereof showing arrangement of the heating stage including the coolant gas blow-off pipe 60 shown in broken lines.

The coolant gas is discharged from gas-blow off openings 60a of the gas blow-off pipe 60 in gas-blow off directions shown in arrows. The coolant gas blow-off pipe 60 is, for example, made of quartz glass.

FIG. 7B is a cross-sectional view of a heating stage 100 showing arrangement of the coolant gas blow-off pipe 60. Arrows show directions in which the coolant gas flows. In addition, in FIGS. 7 and 9, although only one of the lamps 3 is shown for convenience, the actual arrangement is shown in FIG. 4.

As shown in FIG. 7A, in this example, the coolant blow-off pipe 60 is shaped like a ring, wherein coolant gas, such as nitrogen gas, comes out from openings provided in the pipe and flows toward inner space and is discharged from the bottom portion 26 of the metal case portion 20 which is located under the heating stage 100. In this figure, the lamp lead wire, the heat spreader and a work piece to be heated are omitted for convenience.

Figure 8:
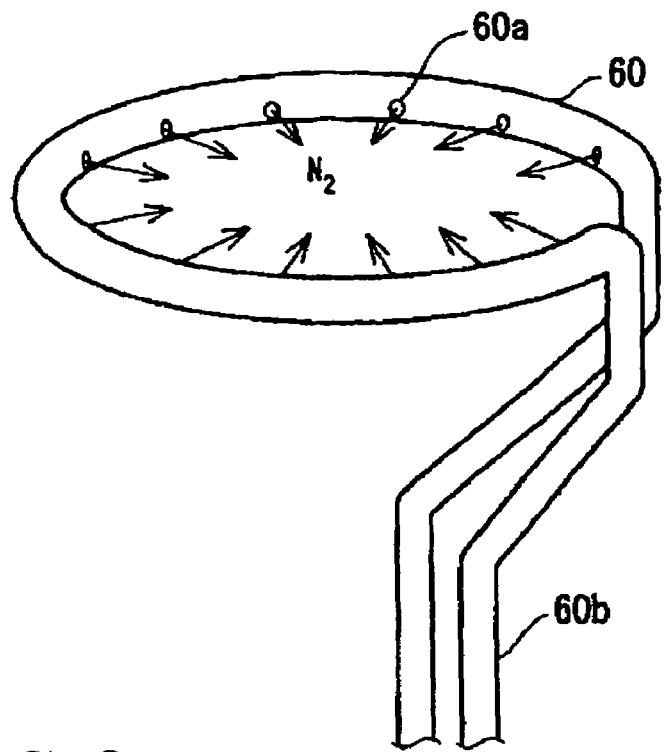
FIG. 8 is a schematic view of the coolant gas blow-off pipe 60.

FIG. 8 is a schematic view of the coolant gas blow-off pipe 60, wherein two gas introducing openings shown in FIG. 7B are provided. Further, leg portions 60b of the coolant gas blow-off pipe are disposed to the respective two gas introducing inlets 10.

Moreover, in FIG. 9, the hollow structure is provided in the glass stage portion 50, wherein gaps G are provided by two or more supports 50a. In this figure, the metal case portion is omitted. Coolant gas directly passes through the gaps G in the hollow structure. The coolant gas from the coolant gas blow-off pipe 60 flows in the gaps G in the direction shown in arrows 60.

Figure 10:
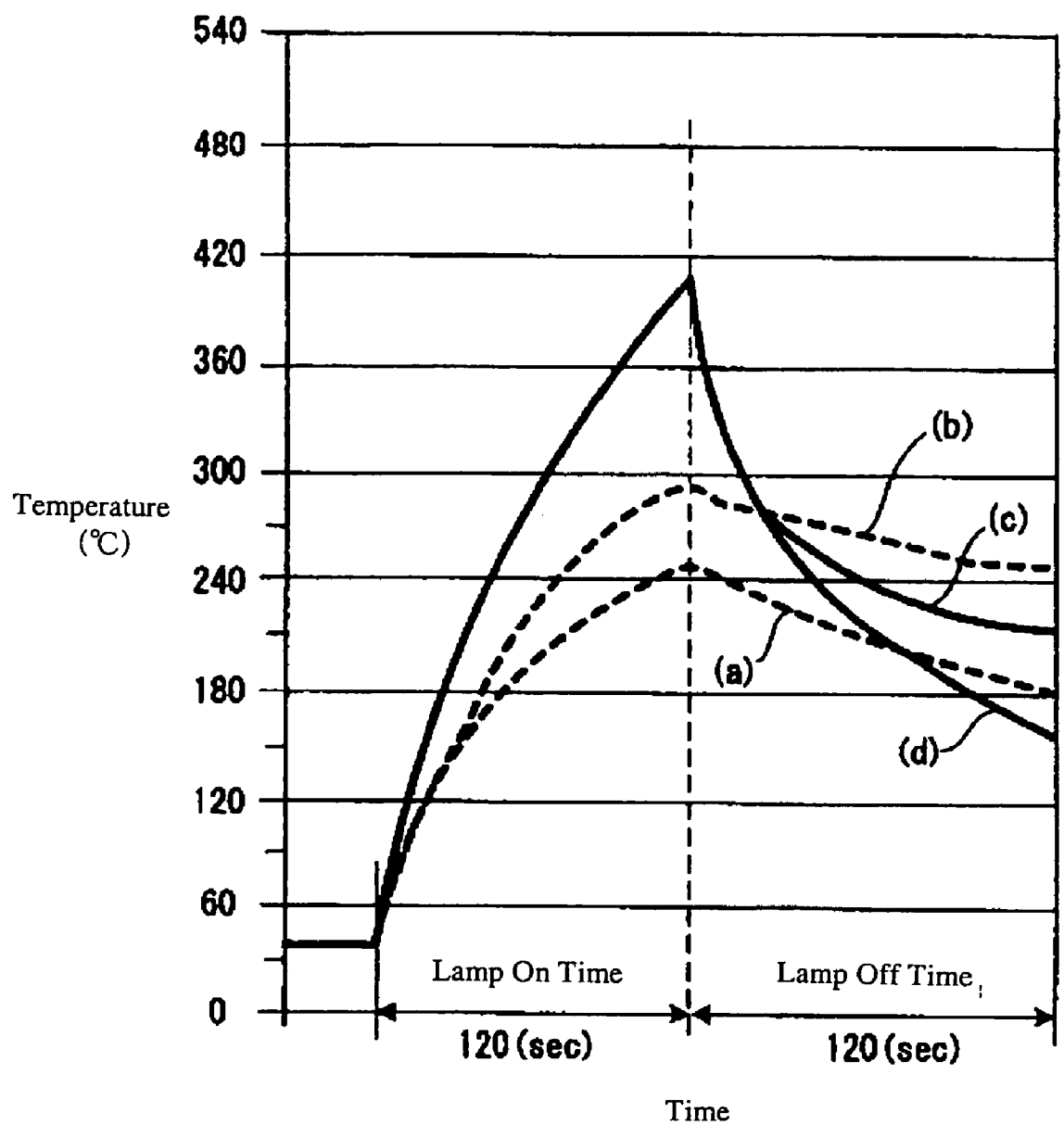
FIG. 10 is a graph showing temperature measurement results of the glass stage portion and silicon wafer in case that the glass stage is cooled down by using the coolant gas blow-off pipe shown in FIGS. 7A and 7B.

FIG. 10 is a graph showing coolant effects.

FIG. 10 shows temperature measurement results of the glass stage portion and a silicon wafer in case that the glass stage is cooled down by using the coolant gas blow-off pipe shown in FIGS. 7A and 7B. For the glass stage, the temperature was measured on the surface thereof, and for the silicon wafer, the temperature thereof was measured by burying a K type thermocouple on the silicon wafer. In this example, the arrangement shown in FIG. 4 was prepared, wherein input voltage to a series of ring like lamps located outside the straight tube shaped lamps was 200 V and input voltage to the straight tube shaped lamps was 200V, and further, the lamps were turned on for 120 seconds and then turned off. The flow rate of the coolant gas was 50 liter/minute.

In the figure, temperature of the glass stage portion is shown in broken lines wherein (a) shows the temperature in case that cooling is carried out, and (b) shows the temperature in case that cooling is not carried out. Moreover, a solid line shows the temperature of the silicon wafer wherein (c) shows the temperature in case that cooling is carried out and (d) shows the temperature in case that the cooling is not carried out.

As shown in the figure of this measurement results, the temperature of the glass stage portion made of quartz glass was raised to about 250 degrees Celsius in case of the cooling, and about 300 degrees C. in case of non-cooling in 120 seconds after lighting. On the other hand, in either case, the temperature of the silicon wafer was raised to about 420 degrees Celsius, without respect to whether cooling is carried out. Thus, there is no effect to the heating temperature of the silicon wafer by the cooling. And in 120 seconds after lamps were turned off, the temperature of the glass stage portion made of quartz glass in case that cooling was not carried out ((c) in the figure) was 250 degrees Celsius and the temperature was dropped to 190 degrees Celsius in case that the cooling is carried out ((d) in the figure).

Moreover, when the temperature of the silicon wafer was 210 degrees Celsius in case that cooling was not carried out, but the temperature was dropped to 150 degrees Celsius in case that cooling was carried out.

Thus, by providing the cooling unit to the stage portion, while there is no problem in raising the temperature of the work piece such as a silicon wafer, the temperature drop can be faster. That is, it is possible to carry out a rapid temperature drop and to shorten "takt" time of a heating process.

Thus the present invention possesses a number of advantages or purposes, and there is no requirement that every claim directed to that invention be limited to encompass all of them.

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A heating stage comprising:
   a flat stage portion made of quartz glass,
   a glass section having a first cylindrical portion in which two or more lamps are disposed as a heating unit, and
   a metal section having a second cylindrical portion and a bottom portion, forming an inner space by fixing the metal section and the glass section integrally wherein the inner space is under reduced pressure, and inert gas is filled.

2. The heating stage according to claim 1, wherein the lamps has sealing portions at both end and a sealing body having a filament therein, and the sealing portion is bent in an opposite direction to a surface of the flat stage portion.

3. The heating stage according to claim 1, further including a light reflecting plate made of ceramic fiber on a back side of the lamp.

4. The heating stage according to claim 1, further including a cooling unit in the stage portion.

5. The heating stage according to claim 4, wherein the cooling unit is a coolant blow-off pipe disposed under the stage portion.

6. The heating stage according to claim 4, wherein the stage portion has a hollow structure, and further including a coolant gas introducing unit wherein the coolant gas pass-through gaps of the hollow structure.

* * * * *